United States Patent [19]
Hayashi

[11] Patent Number: 5,499,717
[45] Date of Patent: Mar. 19, 1996

[54] EMBOSSED CARRIER TAPE SYSTEM

[75] Inventor: Toshisumi Hayashi, Tochigi, Japan

[73] Assignee: Yayoi Corporation, Tokyo, Japan

[21] Appl. No.: 312,963

[22] Filed: Sep. 30, 1994

[30] Foreign Application Priority Data

Sep. 30, 1993 [JP] Japan .................... 5-268298

[51] Int. Cl.⁶ .................. B65D 73/02; B65D 85/42
[52] U.S. Cl. ............... 206/701; 206/713.714;
206/716; 206/722; 206/390
[58] Field of Search .................. 206/328, 329,
206/332, 390, 330, 701, 713, 714, 716,
718, 722, 715, 728

[56] References Cited

U.S. PATENT DOCUMENTS

| | | | |
|---|---|---|---|
| 3,444,993 | 5/1969 | Lunsford | 206/332 |
| 3,523,608 | 8/1970 | Miller | 206/332 |
| 4,562,924 | 1/1986 | Okamoto . | |
| 4,564,880 | 1/1986 | Christ et al. | 206/334 |
| 4,702,370 | 10/1987 | Honda . | |
| 4,736,841 | 4/1988 | Kaneko et al. | 206/328 |
| 4,805,771 | 2/1989 | Hein | 206/328 |
| 4,944,979 | 7/1990 | Gagliano et al. | 206/330 |
| 4,963,405 | 10/1990 | Yamashita et al. | 206/328 |
| 4,966,281 | 10/1990 | Kawanishi et al. | 206/330 |
| 5,064,064 | 11/1991 | Itou et al. | 206/332 |
| 5,076,427 | 12/1991 | Thomson et al. | 206/330 |
| 5,152,393 | 10/1992 | Chenoweth | 206/330 |
| 5,226,226 | 7/1993 | Fierkens | 206/328 |
| 5,234,104 | 8/1993 | Schulte et al. | 206/330 |
| 5,361,901 | 11/1994 | Schenz et al. | 206/332 |

FOREIGN PATENT DOCUMENTS 1262201  2/1972  United Kingdom .

Primary Examiner—Paul T. Sewell
Assistant Examiner—Marie D. Patterson
Attorney, Agent, or Firm—Birch, Stewart, Kolasch & Birch

[57] ABSTRACT

An embossed carrier tape system includes a carrier tape having formed therein a number of pockets spaced at equal intervals longitudinally of the carrier tape for accommodating surface mountable electronic parts. A cover tape extends along the length of the carrier tape in superposition thereover on the side where the pocket opening is provided. The cover tape is provided with an engagement wall adapted to be in contact engagement with the inner walls of the corresponding pockets, and is further provided with a buffer (8) expandable longitudinally of the cover tape and extending transversely of the length of the cover tape at locations over the web portions of the carrier tape between adjacent pockets, whereby the need for adhesively bonding the cover tape and the carrier tape is eliminated. Since the cover tape is secured to the carrier tape only by mechanical engagement, it is easier to remove the cover tape from the carrier tape than to peel the cover tape by rupturing an adhesive bond, so that surface mountable electronic parts may be easily placed in and removed from the pockets. In addition, not only the carrier tape but also the cover tape may be reused because there are no flaws or remnants left on the tapes.

22 Claims, 3 Drawing Sheets

EMBOSSED CARRIER TAPE SYSTEM

BACKGROUND OF THE INVENTION

The present invention relates to an embossed carrier tape system comprising a carrier tape having a plurality of pockets spaced at equal intervals longitudinally of the tape for accommodating surface mountable electronic parts, and a cover tape extending over the carrier tape to close the openings of the pockets.

DESCRIPTION OF RELATED ART

The carrier tape system is designed to temporarily accommodate small electronic parts for the convenience of storage and shipping and also to be utilized as means for automatically mounting small electronic parts on substrates, and basically comprises a carrier tape having a number of pockets spaced at equal intervals longitudinally of the tape for accommodating surface mountable electronic parts, and a cover tape extending along the length of the carrier tape in superposition thereover on the side where the pockets open. The cover tape is usually bonded to the carrier tape to close the openings of the pockets after surface mountable electronic parts have been placed into the respective pockets through automatic operation.

One of the methods of bonding heretofore employed is to apply a temperature sensitive adhesive layer to the lower surface of the cover tape, superpose the cover tape on the carrier tape with the adhesive layer facing the top surface of the carrier tape and adhesively bond the cover tape to the carrier tape by applying heat and pressure to the tapes on the opposite sides of the pockets. See U.S. Pat. No. 4,736,841 to Kaneko et al, for example. Another method is to bond the cover tape to the carrier tape by adhesives applied to the cover tape in the form of narrow bands on the opposite sides of the pockets, as disclosed in U.S. Pat. Nos. 4,963,405 and 5,064,064 to Yamashita et al and Itou et al, respectively.

In either case, however, excessively high bonding strength and/or variations in the bonding strength can lead to tearing of the cover tape when it is to be peeled away from the carrier tape. Only the upper layer of the multilayered cover tape may be peeled off with the adhesive layer remaining bonded on the carrier tape, with the undesirable results ensuing that some of the electronic parts may not successfully be suctioned up from the respective pockets or cannot be removed at all due to interference by the sticky adhesive layer and/or broken pieces of the cover tape remaining bonded on the carrier tape. Consequently, these types of bonding methods require severe control of the bonding strength in order to prevent such accidental events from occurring.

In recent years, contrivances have been made to eliminate the need for such control. For example, U.S. Pat. No. 4,944,979 to Gagliano et al teaches providing the cover tape with lines of perforations inwardly of the adhesive bands to facilitate tearing of the tape along the perforation lines to thereby insure that the cover tape is removed even if there should be variations in the bonding strength.

However, the recent trends are toward requiring resource-saving and recycling of every product. Nevertheless, with the carrier tape to which the cover tape is adhesively bonded by either of the prior art methods described above, there is actually no alternative but to discard the carrier tape by cutting it to lengths suitable to be disposed of, since parts of adhesive and/or broken pieces of the cover tape remaining on the carrier tape make it difficult to reuse the latter.

In an attempt to overcome the aforesaid drawbacks with the prior art, in other words, to eliminate the need for use of adhesives, U.S. Pat. No. 5,234,104 to Schulte et al, for example, teaches the use of a cover tape having opposed side edges each folded downwardly and then inwardly to define a generally U-shaped channel having a width corresponding to the film thickness of a carrier tape so that the cover tape may be secured to the carrier tape without the use of adhesive by inserting the opposed lateral edges of the carrier tape into the corresponding U-shaped channels of the cover tape.

One of the drawbacks to the carrier tape system disclosed in this U.S. Pat. No. 5,234,104 is that the operation of attaching the cover tape to the carrier tape is quite troublesome in that the folded opposite side edges of the cover tape must be expanded to fit over the corresponding lateral edges of the carrier tape during the taping of electronic components.

Another problem with this carrier tape system is that it is hard to coil the tape system having component parts accommodated therein around a reel for storage because it has a substantially increased stiffness in the longitudinal direction as compared with the conventional tape system due to the folded opposite side edges of the cover tape.

Although the carrier tape system of Schulte et al is configured to be repeatedly used, it cannot be reused more than a few times since the side edges of the cover tape will flag at the folded portions as it is repeatedly used.

SUMMARY OF THE INVENTION

Accordingly, it is an object of the present invention to provide an embossed carrier tape system in which a cover tape may be secured to the top surface of a carrier tape where the pockets open and in which not only the carrier tape but also the cover tape may be reused as many times as desired.

Another object of the invention is to provide an embossed carrier tape system which facilitates the taping operation.

Still another object of the invention is to provide an embossed carrier tape system which is easy to wind up on a reel for storage.

In an embossed carrier tape system comprising a carrier tape having formed therein a number of pockets spaced at equal intervals longitudinally of the carrier tape for accommodating surface mountable electronic parts, and a cover tape extending along the length of the carrier tape in superposition thereover on the side where the pockets open, the aforesaid objects of this invention are accomplished by providing said cover tape with engagement wall means adapted to be in contact engagement with the inner walls of the corresponding pockets, and with buffer means expandable longitudinally of the cover tape and extending transversely of the length of the cover tape at locations over the web portions of the carrier tape between adjacent pockets.

The engagement wall means may be configured to engage the inner walls of the pocket by frictional contact, or alternatively to engage the inner walls by a dovetail type engagement. Further, the engagement wall means may be formed to engage the inner walls of the pocket either entirely or partly around the periphery of the pocket.

The buffer means is expandable and contractible only longitudinally of the cover tape, and may be U-shaped, triangular or of any other suitable shape in cross-section.

Preferably, the cover tape is provided with recess means between the engagement wall means, the recess means being configured to embrace the upper portion of the corresponding surface mountable electronic part in a crown cap manner to facilitate the positioning of the electronic part stored in the pocket.

Where the surface mountable electronic parts to be housed in the pockets are QFP packages having an increased number of and more finely pitched connector pins or leads, each of the pockets may preferably have a support floor raised to a certain elevation from the bottom wall of the pocket to support the undersurface of the QFP package so as to lift the leads of the package slightly up from the bottom wall in order to avoid the protruding leads from touching the bottom wall of the pocket and being distorted.

Further, it is preferable that each of the pockets have ribs extending upward from the bottom wall thereof beyond the support floor so as to be in supporting engagement with the lower side faces of the QFP package to thereby position the package in place in the pocket.

The embossed carrier tape is usually kept wound on a reel for storage, shipment, and automatic mounting. Consequently, with the cover tape merely having the engagement wall means adapted to contact and engage with the inner walls of the pockets, there is possibility that the cover tape may accidentally come off, resulting in spilling off of the surface mountable electronic components from the pockets. It is also possible that there may be misalignment between the engagement wall means of the cover tape and the pockets of the carrier tape due to cumulative molding errors with the results that when the tape system is coiled on a reel, the cover tape may be subjected to excessive forces and slip off the carrier tape before the tape system is properly wound up on the reel.

It is due to the buffer means provided on the cover tape at locations over the web portions of the carrier tape between adjacent pockets that the aforesaid inconvenience may be avoided in the present invention. Specifically, even if the tape system is deformed while it is coiled on a reel, the buffer means is capable of accommodating the deformation and cumulative manufacturing errors by expanding or contracting longitudinally of the cover tape to prevent the cover tape from coming off.

Being capable of expanding and contracting longitudinally of the cover tape, the buffer means serves to reduce the stiffness of the cover tape in the longitudinal direction and hence reduce the resistance to winding, to thereby facilitate winding of the tape system around a reel. The buffer means may have a plurality of holes formed therethrough to render the winding operation further easy.

Since the cover tape is secured to the carrier tape only by mechanical engagement, it is easier to remove the cover tape from the carrier tape than to peel the cover tape by rupturing the adhesive bond, so that surface mountable electronic parts may be easily placed in and removed from the pockets. In addition, not only the carrier tape but also the cover tape may be reused because there are no flaws or remnants left on the tapes.

BRIEF DESCRIPTION OF THE DRAWINGS

The foregoing summary, as well as the following detailed description, will be better understood when read in conjunction with the accompanying drawings, in which.

DESCRIPTION OF THE PREFERRED EMBODIMENTS

Figure 1:
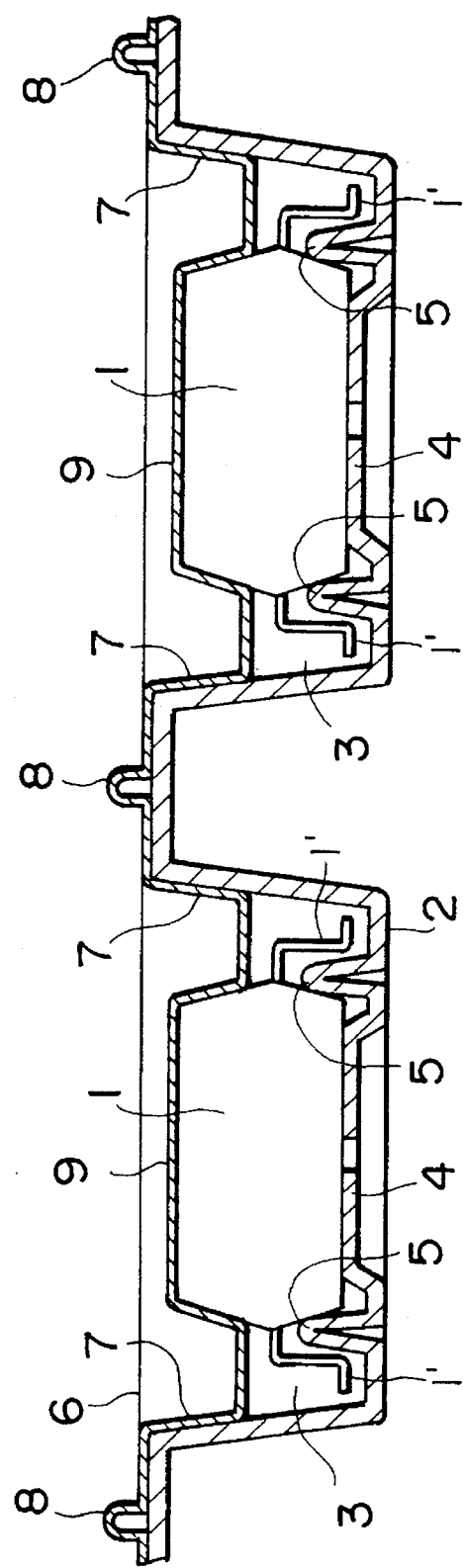
FIG. 1 is a fragmentary, vertical cross-sectional view illustrating one embodiment of the tape system of this invention.

Referring to the drawings, wherein like numerals indicate like elements throughout the several drawings, FIG. 1 shows a vertical cross-section of a portion of a longitudinally extending embossed carrier tape system according to one embodiment of this invention which is designed to accommodate QFP packages which are surface mountable electronic components by way of example. It should be understood, however, that the present invention is not limited to storage of any particular component part. QFP packages 1 are housed in the respective pockets 3 formed in longitudinally equally spaced intervals in a carrier tape 2.

The QFP package has been rendered more and more compact and thin in size and provided with an increased number and finer pitch of connector pins or leads 1 with the enhanced level of integration, so that the leads 1 protruding from the package are vulnerable to distortion. In view of this, the central portion of the bottom wall of each of the pockets 3 is raised as illustrated to define a flat support floor 4 so that the leads 1 of the package 1 are kept out of engagement with the bottom wall as the package is supported on the raised support floor above the bottom. In addition, the bottom wall of the pocket has ribs 5 extending upward therefrom at some distance away from the support floor 4 to surround and support the lower portions of the four side faces of the package 1 to thereby position the package in place in the pocket. As seen in FIG. 1, gaps are defined between the support floor 4 and the adjacent ribs 5 whereby the ribs are prevented from touching the corners of the package to permit precise positioning of the package in place in the pocket.

Once QFP packages 1 have been accommodated in the respective pockets 3, the openings of those pockets are closed by a cover tape. While either heat and pressure bonding or adhesive bonding has been conventionally used to bond the cover tape to the carrier tape, the present invention eliminates the use of such type of bonding. To this end, the cover tape 6 is provided with engagement wall means 7 complementarily shaped so as to be nested into the square opening (see FIG. 2) of the corresponding pocket in contact engagement with the inner wall of the pocket. The engagement wall means 7 is shaped complementarily with, but slightly oversized with respect to the opening of the pocket 3 to provide increased frictional force between the contact engagement wall means and the inner wall of the pocket.

Figure 2:
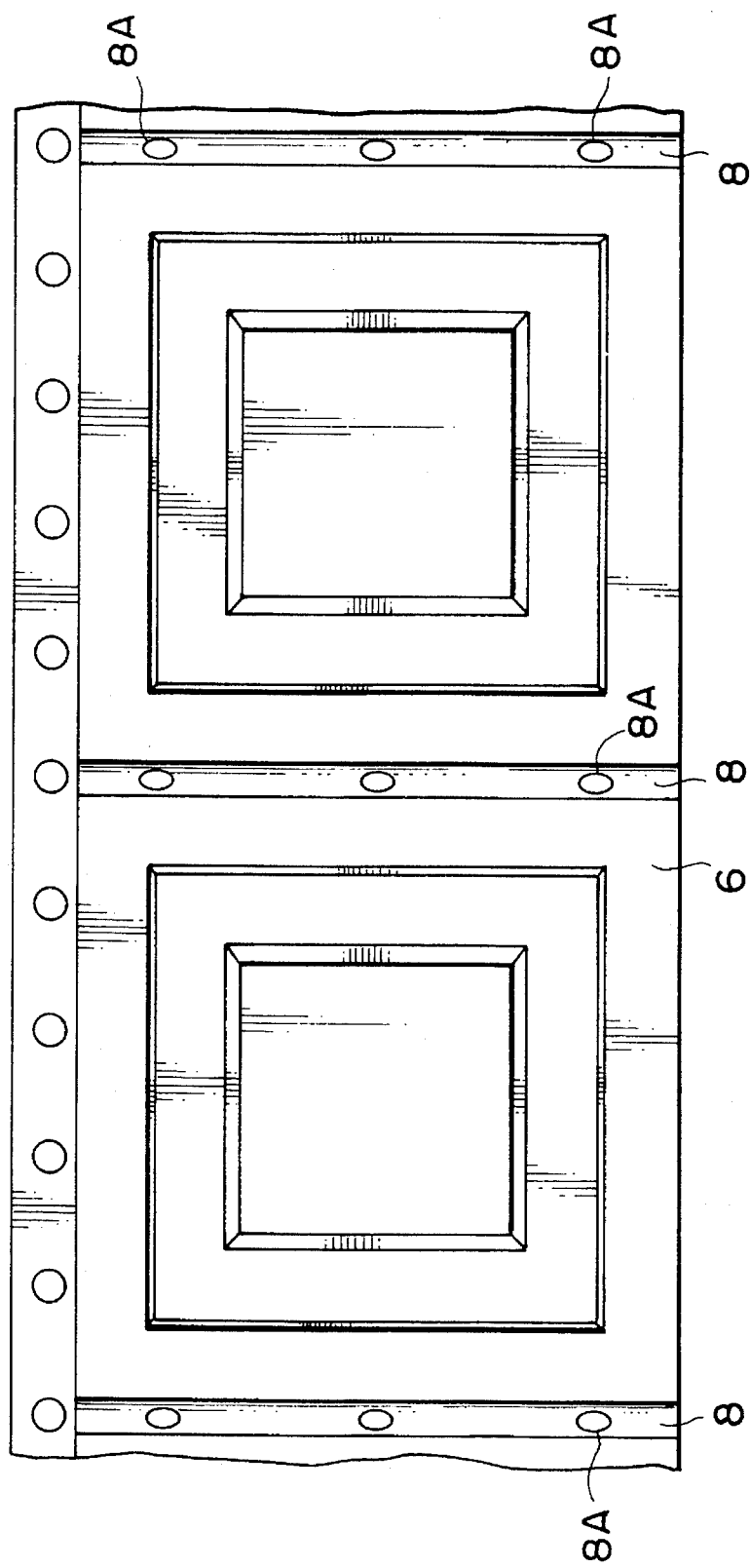
FIG. 2 is a plan view of the tape system shown in FIG. 1.

It is difficult in manufacture to form the pockets 3 of the carrier tape 2 and the corresponding engagement wall means 7 of the cover tape 6 in precise alignment with each other. In order to accommodate any deformation of the tape system which may take place when it is coiled around a reel for storage as well as to take up accumulative manufacturing errors, the cover tape 6 is formed with buffer means or expansion means 8 expandable longitudinally of the tape at locations over the web portions of the carrier tape between adjacent pockets. The buffer means 8 extends transversely of the tape as shown in FIG. 2. While the buffer means 8 is shown as having a U-shaped cross-section in the illustrated embodiment, it may be in the form of a channel having a triangular cross-section. The buffer means 8 may further have one or more preferably equally spaced apart holes 8A formed therethrough to facilitate winding of the tape system around a reel.

Due to the buffer means 8 provided on the cover tape 6, it is possible to position the QFP package 1 in place in the pocket from the cover tape side as well as from the pocket side. In the illustrated embodiment, the cover tape is further provided with recess means 9 inwardly of the square-shaped engagement wall means 7 to embrace the upper portion of the QFP package 1 in a crown cap manner to thereby provide for three-dimensional positioning of the package. The recess means 9 also serves to increase frictional force between the engagement wall means and the inner wall of the pocket as it increases the stiffness of the cover tape, in addition to aiding in the positioning of the package in place.

During the taping process, QFP packages 1 are placed in the respective empty pockets 3, followed by superposing the cover tape over the carrier tape to close the pockets with the engagement wall means 7 nested into the openings of the corresponding pockets. As the taping operation proceeds, the embossed carrier tape system having packages stored in the pockets is successively coiled on a reel (not shown) with the carrier tape 2 and cover tape 6 facing inwardly and outwardly, respectively. As the tape system is wound up, the cover tape 6 is elongated under tension, which elongation is absorbed by longitudinal expansion of the buffer means 8, whereby the cover tape is prevented from coming off the carrier tape during the winding operation. In addition, it is easy to peel the cover tape 6 from the carrier tape to expose the QFP packages as the tape system is unwound from the reel during the component mounting operation because no adhesive is used. The separated cover tape is coiled on a reel while at the same time the carrier tape is also wound around a reel. The thus wound up cover tape and carrier tape may both be reused since there are no flaws or remnants left on the tapes.

Figure 3:
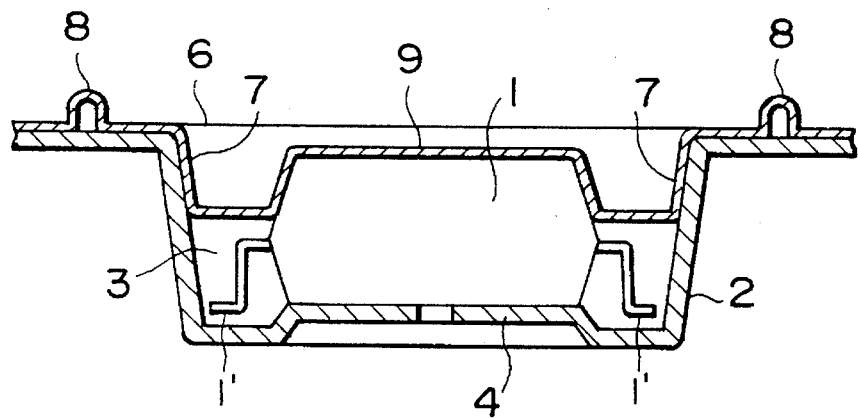
FIG. 3 is a fragmentary, vertical cross-sectional view illustrating another embodiment of the tape system of this invention.

FIG. 3 shows another embodiment of the tape system of this invention in which the positioning ribs 5 provided on the bottom of the pocket in the previous embodiment are omitted because the recess means 9 provided on the cover tape 6 is capable of positioning the QFP package in place. As the remaining construction is identical to that of the FIG. 1 embodiment, further description is omitted for purposes of convenience.

Figure 4:
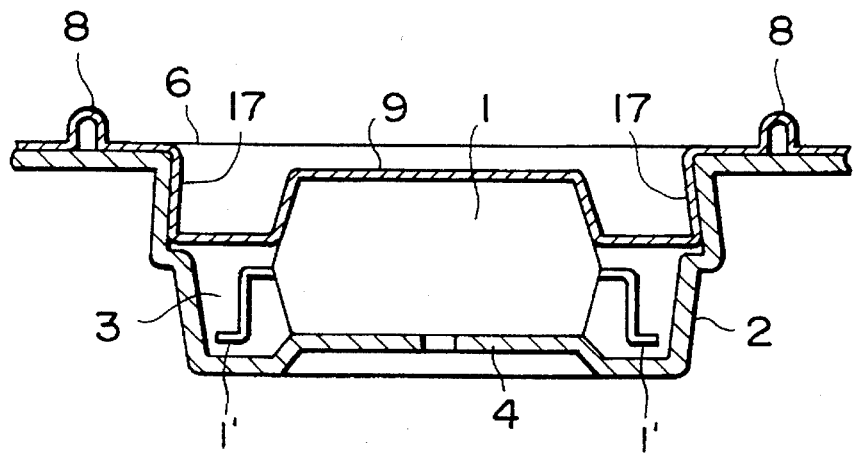
FIG. 4 is a view similar to FIG. 3, but illustrates still another embodiment of the tape system of this invention.

FIG. 4 shows yet another embodiment of the tape system of this invention which is similar to that of FIG. 3 except that engagement wall means 17 have a different configuration than the engagement wall means 7 in FIG. 3. Specifically, the distance between the opposed wall portions of the engagement wall means 17 in this embodiment is increased progressively in the direction of the depth of the pocket, that is, towards the bottom of the pocket 3, and the distance between a opposed inner walls of the pocket is correspondingly increased in the direction of the depth.

It is to be understood that this embodiment is designed to interlock the engagement wall means 17 and the inner wall of the pocket utilizing the dovetail type engagement rather than the frictional force, and that the construction of this embodiment has a greater strength to withstand any shock that the taper system may encounter during shipment than the embodiments shown in FIGS. 1 and 3.

I claim:

1. An embossed carrier tape system comprising: a reusable carrier tape including a plurality of equidistantly spaced pockets formed within and longitudinally of said carrier tape for accommodating surface mountable electronic components, each electronic component including a lower surface, an upper surface and generally vertical side surfaces, and each of said pockets having generally vertical side walls, a base floor, and a support floor spaced apart from said base floor for supporting at least a middle portion of the lower surface of the electronic component, and connector means, formed between adjacent ones of said plurality of pockets, for linearly and serially connecting said plurality of pockets; and a reusable cover tape extending along the length of and superposed over said carrier tape and facing open sides of said plurality of pockets, said reusable cover tape including depending engagement walls frictionally mating with the side walls of said pockets, and buffer means, formed of at least one rib member, extending transversely of the length of said cover tape and superposed over said connector means, for selectively expanding and contracting longitudinally of the cover tape relative to the connector means of said carrier tape, whereby said cover tape is deformable relative to said carrier tape so as to maintain the frictional mating engagement between said depending engagement walls and the side walls of said pockets.

2. The embossed carrier tape system of claim 1, wherein the distance between at least one pair of opposed walls of each of said pockets is increased progressively in the direction of depth of the pocket, the distance between corresponding opposed wall portions of the engagement walls being increased progressively at substantially the same rate in the direction of depth of the pocket.

3. The embossed carrier tape system of claim 2, wherein said opposed walls of each of said pockets extend longitudinally of said carrier tape.

4. The embossed carrier tape system of claim 2, wherein said opposed walls of each of said pockets are walls extending transversely of the length of said carrier tape.

5. The embossed carrier tape system of claim 1, wherein said cover tape includes recess means for embracing and retaining the upper surface of the electronic component in a capping manner.

6. The embossed carrier tape system of claim 2, wherein said cover tape includes recess means for embracing and retaining the upper surface of the electronic component in a capping manner.

7. The embossed carrier tape system of claim 3, wherein said cover tape includes recess means, for embracing and retaining the upper surface of the electronic component in a capping manner.

8. The embossed carrier tape system of claim 4, wherein said cover tape includes recess means for embracing and retaining the upper surface of the electronic component in a capping manner.

9. The embossed carrier tape system of claim 1, wherein said at least one rib member has a U-shaped cross-section and opening toward said carrier tape.

10. The embossed carrier tape system of claim 2, wherein said at least one rib member has a U-shaped cross-section and opening toward said carrier tape.

11. The embossed carrier tape system of claim 3, wherein said at least one rib member has a U-shaped cross-section and opening toward said carrier tape.

12. The embossed carrier tape system of claim 4, wherein said at least one rib member has a U-shaped cross-section and opening toward said carrier tape.

13. The embossed carrier tape system of claim 5, wherein said at least one rib member has a U-shaped cross-section and opening toward said carrier tape.

14. The embossed carrier tape system of claim 9, wherein said buffer means includes at least one hole formed therethrough.

15. The embossed carrier tape system of claim 1, wherein said buffer means includes a plurality of holes formed therethrough, said holes being equally spaced apart transversely of the length of said cover tape.

16. The embossed carrier tape system of claim 2, wherein said buffer means includes a plurality of holes formed therethrough, said holes being equally spaced apart transversely of the length of said cover tape.

17. The embossed carrier tape system of claim 3, wherein said buffer means includes a plurality of holes formed therethrough, said holes being equally spaced apart transversely of the length of said cover tape.

18. The embossed carrier tape system of claim 4, wherein said buffer means includes a plurality of holes formed therethrough, said holes being equally spaced apart transversely of the length of said cover tape.

19. The embossed carrier tape system of claim 5, wherein said buffer means includes a plurality of holes formed therethrough, said holes being equally spaced apart transversely of the length of said cover tape.

20. The embossed carrier tape system of claim 1 in combination with an electronic component, wherein said electronic component has leads protruding therefrom, and a height of said support floor of each of said pockets as measured from a plane passing through and parallel with said base floor keeping the leads of the corresponding electronic component out of contact with the base floor of the pocket.

21. The embossed carrier tape system of claim 20, wherein each of the pockets has ribs outwardly of the outer periphery of said support floor between lower portions of the side surfaces of the corresponding electronic component and the leads of said electronic component, said ribs being so positioned as to contact and support the lower portions of the side surfaces of the electronic component but to be kept out of contact with the leads of the electronic component.

22. The embossed carrier tape system of claim 20, wherein said support floor has a surface area smaller than an area of the lower surface of the corresponding electronic component, said ribs extending upwardly from the base floor of the corresponding pocket around the outer periphery of said support floor paragraph. This rejection is respectfully traversed.

\* \* \* \* \*